United States Patent [19]

Harsch et al.

[11] 4,350,132
[45] Sep. 21, 1982

[54] APPARATUS FOR DRIVING ELECTROMAGNETIC DEVICES, PARTICULARLY ELECTROMAGNETIC INJECTION VALVES IN INTERNAL COMBUSTION ENGINES

[75] Inventors: Klaus Harsch, Ditzengen; Peter Schülzke, Hemmingen, both of Fed. Rep. of Germany

[73] Assignee: Robert Bosch GmbH, Stuttgart, Fed. Rep. of Germany

[21] Appl. No.: 256,753

[22] Filed: Apr. 23, 1981

Related U.S. Application Data

[63] Continuation of Ser. No. 65,700, Aug. 10, 1979, abandoned.

[30] Foreign Application Priority Data

Aug. 11, 1978 [DE] Fed. Rep. of Germany ....... 2835228

[51] Int. Cl.$^3$ .......................... F02B 3/00; H01H 47/32
[52] U.S. Cl. ..................................... 123/490; 123/478; 123/472
[58] Field of Search ............... 123/478, 490, 472, 473; 361/152, 154, 156; 307/252 K; 251/129, 132

[56] References Cited

U.S. PATENT DOCUMENTS

| | | | |
|---|---|---|---|
| 2,886,015 | 5/1959 | Steinke | 123/478 |
| 2,970,246 | 1/1961 | Gunkel | 123/473 |
| 3,021,454 | 2/1962 | Pickens | 123/490 |
| 3,810,449 | 5/1974 | Chollet et al. | 123/490 |
| 3,982,505 | 9/1976 | Rivere | 361/154 |
| 4,092,717 | 5/1978 | DiNunzio | 123/490 |
| 4,154,198 | 5/1979 | Hoshi | 123/490 |
| 4,173,030 | 10/1979 | Rabe | 123/490 |

Primary Examiner—P. S. Lall
Attorney, Agent, or Firm—Edwin E. Greigg

[57] ABSTRACT

An apparatus is proposed for driving electromagnetic devices, in particular electromagnetic injection valves in internal combustion engines. The apparatus includes a signal source for actuating pulses and is characterized in that at least one timing circuit is provided for advanced magnetization, preferably dependent on operating characteristics, of the electromagnetic device. The apparatus achieves the most linear possible relationship between the duration of the actuating pulse and, for example, the opening time of the injection valve. In this manner, the fuel quantity to be supplied to the internal combustion engine can be more precisely dosed and the operational behavior of the engine can be made optimal. Because of the advanced magnetization, the electromagnetic injection valve, for example, attracts more rapidly at the onset of the actuating pulse, because the magnetic coil has already stored a certain amount of energy, which lies somewhat below that amount which is required for attraction on the part of the magnetic core and thus for the ejection of fuel.

8 Claims, 6 Drawing Figures

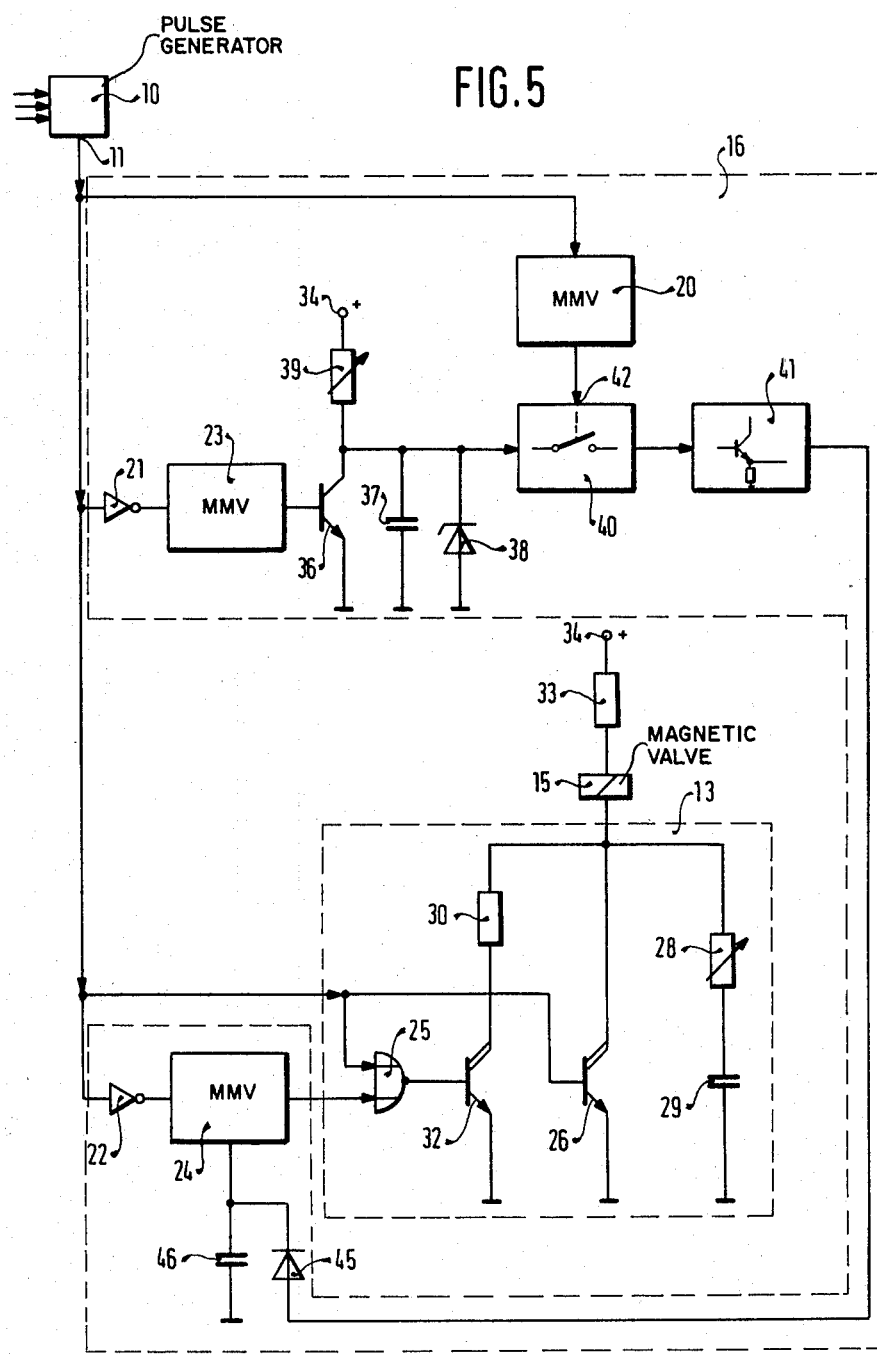

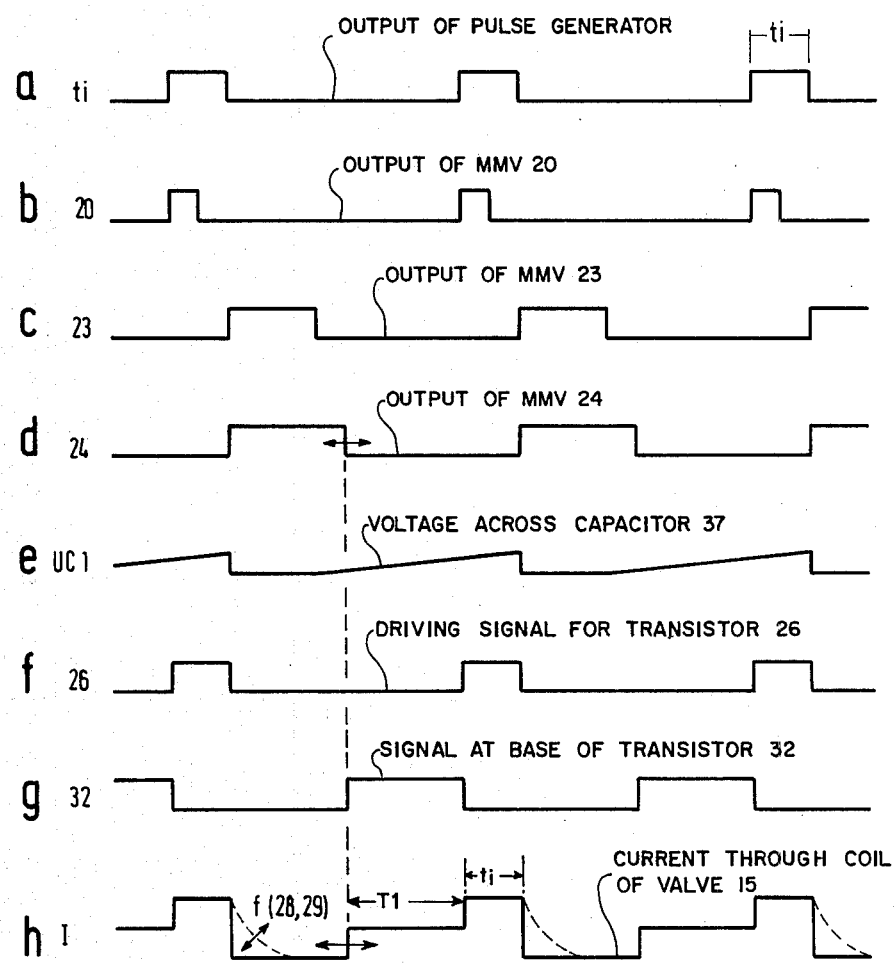

APPARATUS FOR DRIVING ELECTROMAGNETIC DEVICES, PARTICULARLY ELECTROMAGNETIC INJECTION VALVES IN INTERNAL COMBUSTION ENGINES

This is a continuation of application Ser. No. 65,700 filed Aug. 10, 1979, now abandoned.

BACKGROUND OF THE INVENTION

The invention relates to an apparatus for driving electromagnetic devices, and in particular, electromagnetic injection valves in internal combustion engines which are provided with actuating pulses.

Apparatuses are known in which current flow is sent through the magnetic coil of the electromagnetic device at the onset of an actuating pulse, in order to assure rapid attraction on the part of the magnetic core. In these apparatuses, very high currents must sometimes be used because the starting point for actuation is a zero current flow. These high current flows are expensive to provide. With these apparatuses there is not, available, moreover, an energy source capable of furnishing the desired high current flows with the necessary rapid increase in current. If such a current source is not available, then a sufficiently rapid increase in current cannot be achieved, and thus a rapid attraction of the magnetic core is foreclosed, so that in turn, the onset of injection, for instance, in the case of electromagnetic injection valves, is delayed.

OBJECTS, SUMMARY AND ADVANTAGES OF THE INVENTION

It is an object of the invention to improve upon the known apparatuses by a bias or an advanced magnetization of the electromagnetic device in order to attain the desired effect at the onset of an actuating pulse with a relatively small amount of supplementary energy.

In order to attain the desired linear relationship between the duration of the actuating pulse and, for example, the opening time of an injection valve, it is desirable to provide not only a secure and precisely timed opening of the injection valve but a correspondingly secure and precisely timed closing of the valve as well. With the valve closing time there is associated a release lag, i.e., the magnetic core does not react instantaneously. The release lag, which is dictated by the laws of physics, must thus be kept very short to maintain the desired precision. In the case of actuating pulses which occur in rapid succession, there is the problem that the open-valve period, because of the release lag, is not yet entirely terminated at the beginning of the next advanced magnetization phase. In the borderline case, with synchronized control, this would result in a so-called hydraulic continuous-wave operation, which is to be avoided. That is, a condition would be created during which the valve fails to completely close between pulses.

It is, therefore, another object of the invention to provide measures which assure both a secure and precisely timed onset and corresponding end to the opening period of the device, and to do so at the highest possible rate of repetition of the actuating pulses.

The apparatus, in accordance with the invention, has the advantage over the known apparatuses of a high degree of identity between the actuating pulse and the behavior of the electromagnetic device.

A further advantage is that only a very limited increase in current is required for the attraction of the core of the electromagnetic device, so that the appropriate switching elements can be of low output dimensions.

The control of advanced magnetization, the duration of which is a function of operational characteristics of the engine, accomplishes a sure release of the core even with a rapid succession of pulses and thus, for example, a sure interruption of the fuel supply to an internal combustion engine. It has proved to be particularly advantageous when using the apparatus in connection with electromagnetic injection valves in internal combustion engines for the advanced magnetization to be dependent, for example, on rpm, load and/or temperature.

BRIEF DESCRIPTION OF THE DRAWINGS

FIG. 5 shows a block circuit diagram of the apparatus in accordance with the invention; and FIG. 6 illustrates the pulse diagrams pertaining to the apparatus of FIG. 5.

DESCRIPTION OF THE PREFERRED EMBODIMENTS

Figure 1:
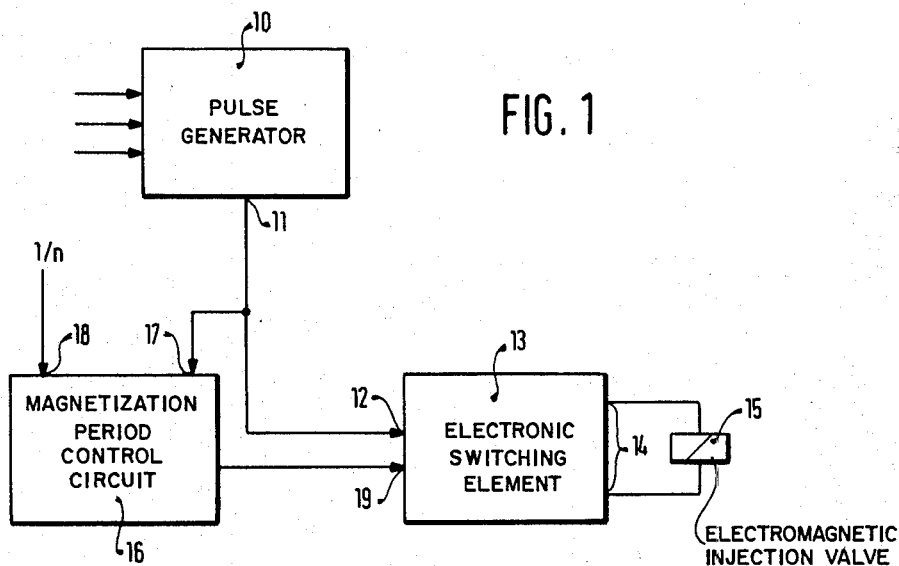
FIG. 1 is a schematic block circuit diagram of the apparatus for driving an electromagnetic switching system.

In FIG. 1, the apparatus for driving electromagnetic injection valves in internal combustion engines is shown schematically. The apparatus includes a pulse generator stage 10, with various operational characteristics of the engine as inputs. The pulse generator stage 10 furnishes, in a known manner, an injection pulse of length ti. The output 11 of the pulse generator stage 10 is coupled with an input 12 of an electronic switching element 13, to whose output 14 in turn the electromagnetic injection valve 15 is connected. A magnetization period control circuit arrangement 16 receives the injection pulses from the pulse generator stage 10 via an input 17 and a period duration signal 1/n relating to the rpm of the engine via an input 18. The input 18 is intended to indicate the advanced magnetization dependent on operational characteristics of the magnetic valve, although in the circuit layout of FIG. 5, this separate input 18 can be omitted. On the output side, this control circuit arrangement 16 for the advanced magnetization time is coupled to a further input 19 of the electronic switching element 13.

Figure 2:
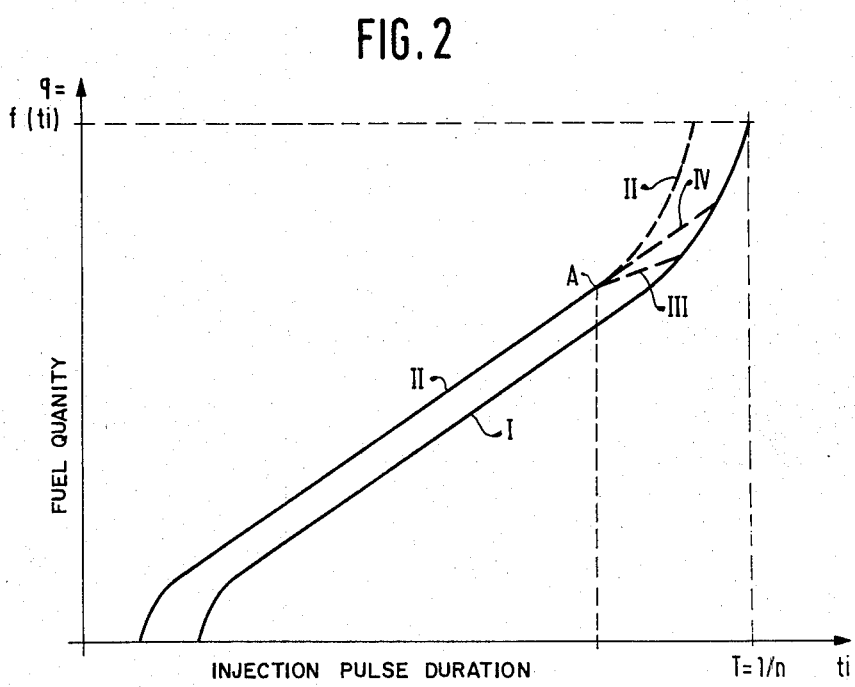
FIG. 2 shows the relationship between the duration of the actuation pulse in an electromagnetic injection valve and the injection fuel quantity with and without advanced magnetization.

In FIG. 2, the fuel quantity q ejected by an electromagnetic injection valve is plotted against the duration of the injection pulse ti. The curve marked I shows the fuel quantity without advanced magnetization of the injection valve and the curve marked II, in a corresponding manner, shows the injected quantity with advanced magnetization having a constant duration. Both curves are distinguished by a non-linear initial section, a straight section, and a non-linear terminal section. With advanced magnetization, the terminal section of curve II splits, depending upon whether the advanced magnetization time is to be constant or the shutoff time is to be constant. It can be seen that the injection quantity differs at an identical duration of the injection pulse ti, with the injected quantity being larger in the case of driving the injection valve with advanced magnetization (curve II) than in the case of driving the injection valve without advanced magnetization (curve I). This results because the injection valve is actuated more rapidly at the onset of the injection pulse with advanced magnetization and thus can inject fuel more rapidly, while the end of injection is identical in both variants.

The vertical broken line shown on the right-hand side of FIG. 2 indicates continuous-wave operation, that is, an injection time T which corresponds to the period duration of the injection signal 1/n.

Figure 3:
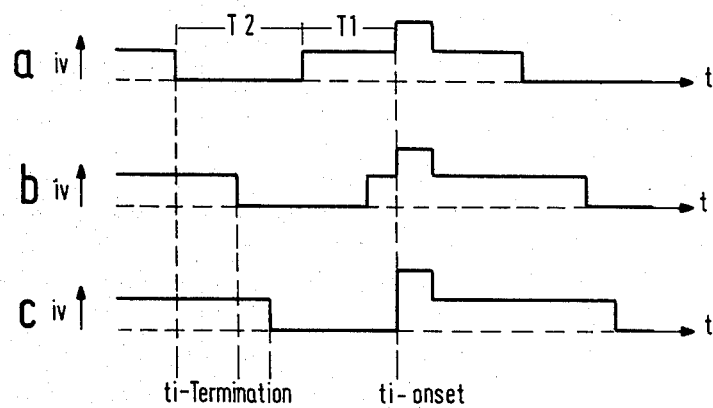
FIG. 3 schematically illustrates the current profile with the release time of the valve current, in order to obtain a sure release.
Figure 4:
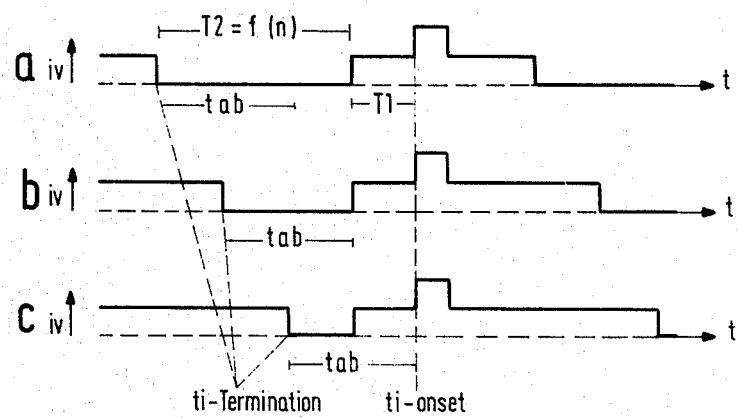
FIG. 4 schematically illustrates the valve current profile with the advanced magnetization time being dominant, in order in each case, to obtain an optimal attraction of the injection valve.

Curve II shows the course of the fuel quantity injected against the injection time at a constant advanced magnetization time T1 (see also FIGS. 3 and 4). In comparison with curve I, curve II is simply shifted parallel. If T1 is selected to be long enough, then a further lengthening does not cause any further shortening of the magnetization time. This case is illustrated in FIG. 2, curve II.

Curve III shows the conditions at a constant shutoff time T2 (see also FIGS. 3 and 4). At large ti values, the effective advanced magnetization time is shortened, because the next advanced magnetization appears before the preceding injection pulse has run its course. Curve III thus tends, with increasing ti, to coincide with curve I (without advanced magnetization). For smaller ti values (left of point A), at a constant time T2 the resulting advanced magnetization time T1 is longer than what corresponds to the threshold value of curve II; that is, curve III tends to coincide with curve II.

Curve IV has the longest linear section extending into the high range for ti; in order to realize curve IV, the shutoff time and/or the time of advanced magnetization is controlled. For smaller ti values (left of point A), a more-rapid magnetization time than that corresponding to curve II cannot be attained; that is, curve IV tends to coincide with curve II.

FIG. 3 schematically illustrates a profile of the current flow through the magnetic valve in the event that the release time, T2, of the valve, that is, the interval between pulses, and thus between injections is dominant. The individual diagrams a through c of FIG. 3 show the current profile at varying frequencies of the injection pulses of duration ti. For the purposes of clarification, the onset of a particular injection pulse (that is, the time at which the current value is sufficiently high to move the magnetic core) is indicated approximately at the center of FIG. 3 for each diagram, and the pulse releases or terminations indicated at the left-hand edge, mark the end of the particular injection time. At increasing rpm and with a constant pulse interval between the end of the injection pulse and the beginning of the next advanced magnetization, there results a shorter and shorter advanced magnetization time interval T1. In the diagram of FIG. 3a, the advanced magnetization is fully effective; in the diagram of FIG. 3b, advanced magnetization is only partially effective, and in the diagram of FIG. 3c, it is entirely absent. This pattern (FIG. 3c) corresponds in principle to the current profile in a valve which is driven in accordance with the known apparatuses.

FIG. 4 schematically illustrates the current profile through the magnetic valve at a constant advanced magnetization time T1. The pulse releases on the left-hand side of FIG. 4 again characterize the end of an injection pulse. The release time of the magnetic valve is indicated by the reference tab. It can be seen that in the diagram of FIG. 4a, the valve release, that is the time required for the valve to close against its valve seat, is undisturbed; in the diagram of FIG. 4b there is shown a condition where the valve release is complete at precisely the beginning of the next advanced magnetization period, that is, the valve release is undisturbed; and in contrast in the diagram of FIG. 4c, the valve release is disturbed, so that the danger is present in this case of a hydraulic continuous-wave operation. FIG. 4c makes clear the necessity for the control of an advanced magnetization, in accordance with operational characteristics, of the magnetic valve coil. This is particularly important when the period duration of the injection pulses assume an order of magnitude like that of the injection pulses. This is possible, especially when the total fuel quantity supplied to an internal combustion engine is intended to be injected via a single valve.

FIG. 5 shows, in a block circuit diagram, one possible embodiment of an apparatus for achieving the curve patterns of FIG. 3; that is, a control of the advanced magnetization time in one injection valve in accordance with operational characteristics. The output of the pulse generator stage 10 is coupled to the trigger input of a first timing element or monostable multivibrator 20, via a first inverter 21 with a second timing element or monostable multivibrator 23, and via a second inverter 22 with a third timing element or monostable multivibrator 24. The output of the pulse generator stage 10 is also connected with a first input of a NOR-gate 25 and the base of a switching transistor 26 lying in series with the magnetic valve 15. Lying parallel to the emitter-collector path of this transistor 26 are both a series circuit comprising a resistor 28 and a capacitor 29 and a series circuit comprising a resistor 30 and the collector-emitter path of a transistor 32. The end of the magnetic valve 15 remote from this parallel layout is connected via a resistor 33 with a positive line 34 of a voltage supply system.

The output of the NOR-gate 25 is coupled with the base of the transistor 32. The second input of this NOR-gate 25 is connected with the output of the monostable multivibrator 24.

The output of the second monostable multivibrator 23 is conveyed to the base of a transistor 36, whose emitter is connected to ground and parallel to whose emitter-collector path are a capacitor 37 and a Zener diode 38. The collector of the transistor 36 and thus the capacitor 37 and Zener diode 38 are connected via a resistor 39 with the positive line 34. The voltage across the capacitor 37 can be transmitted by means of a switch 40 to the input of a coupler stage 41. The switch 40 receives its switching signal via a control input 42 from the output of the first monostable multivibrator 20. On the output side, the coupler stage 41 is connected via a diode 45 with a capacitor 46, which in turn is coupled to the control input of the third monostable multivibrator 24.

The mode of operation of the circuit of FIG. 5 is effectively explained with the aid of the pulse diagrams of FIG. 6. In FIG. 6a, the output signal of the pulse generator stage 10 is shown; that is, FIG. 6a shows the injection pulses of length ti. The output signal of the first monostable multivibrator 20 is shown in FIG. 6b. Correspondingly, FIGS. 6c and 6d show the output signals of the second and third monostable multivibrators 23 and 24, and it will be appreciated that the first monostable multivibrator 20 is triggered by the leading edge of the injection signal of FIG. 6a and the second and third monostable multivibrators 23 and 24 are triggered by the trailing edge of the injection signal of FIG. 6a. The horizontal double-headed arrow at the trailing edge of the output signal of the third monostable multivibrator 24 indicates the controlling of this signal in accordance with the voltages of the capacitors 46 and 37 and thus indicates an rpm dependency.

FIG. 6e shows the profile of the voltage variation across the capacitor 37. For the pulse duration of the output signal of the second monostable multivibrator 23 (FIG. 6c), the subsequent transistor 36 conducts, and thus, no voltage signal is present across the capacitor 37. During the pulse intervals of the output signal of the second monostable multivibrator 23, however, the voltage signal across the capacitor 37 increases, through the constant resistor 39 to the constant supply voltage on the positive line, and in an exponential fashion up to the next trailing edge of the rising signal. The steepness of this voltage increase is in accordance with the timing constant derived from resistor 39 and capacitor 37.

FIG. 6f shows the driving signal of the switching transistor 26, which is identical to the injection signal having the duration ti of FIG. 6a. In FIG. 6g, the potential at the base of the transistor 32 is shown. Because of the logical connection of the injection signal from the output 11 of the pulse generator stage 10 and the output signal of the third monostable multivibrator 24, there is a positive signal at the base of the transistor 32 only when neither an injection signal, in accordance with FIG. 6a, nor the output signal of the third monostable multivibrator 24, in accordance with FIG. 6d, appears.

Finally, FIG. 6h shows the flow of current through the magnetic coil 15 of the magnetic valve. The advanced magnetization by means of a small current can be seen before the duration times of the injection pulses ti. The double-headed arrow shown during the ascending edge of the advanced magnetization current indicates a shift in the timing of this ascending edge on the basis of the output signal of the third monostable multivibrator 24, for the signal behavior of which, in turn, the signal behavior of the second monostable multivibrator 23 and the timing behavior of resistor 39 and capacitor 37 represent the standard. The trailing edge of the magnetic current may be determined as to its function by the RC elements 28, 29. This is illustrated by the double-headed arrow bearing the identifying reference f (28,29).

The voltage signal of capacitor 37 carried over at the onset of the injection pulse, during the switching time of the first monostable multivibrator 20, which signal is dependent on rpm, controls via the third monostable multivibrator 24 the blocking time for the transistor 32 at the end of the injection pulse. Simultaneously, by means of the second monostable multivibrator 23, the capacitor 37 is rapidly discharged by means of the transistor 36, in order to be able to form the rpm-dependent signal during the ti interval.

The pulse diagrams of FIGS. 3 and 4 provide for a division of the valve current in half over the duration of the injection pulse in such a manner that at the onset an increased attraction current is furnished and subsequently a so-called maintenance current (lower level current) flows through the magnetic valve. This progression serves to permit the application of the necessary energy during the stroke phase of the core of the magnetic valve and subsequently, during the maintenance phase which requires less energy, to permit accordingly less current to flow. In the circuit of FIG. 5, this progression is not provided, because it is particularly the controlling of the advanced magnetization which is the subject of the invention. A combination of the subject of FIG. 5, that is, the controlling of the advanced magnetization, with a known possible realization of the current progression corresponding to the diagrams of FIGS. 3 and 4, such as a current-controlled terminal stage, is not a matter of any difficulty for the person familiar with the art.

The foregoing relates to a preferred embodiment of the invention, it being understood that other embodiments and variants thereof are possible within the spirit and scope of the invention, the latter being defined by the appended claims. For example, the timing elements are chosen to preferably be monostable multivibrators, although other equivalent timing elements may be employed.

What is claimed and desired to be secured by Letters Patent of the United States is:

1. In an apparatus for driving an electromagnetic device, such as the electromagnetic fuel injection valves of an internal combustion engine, having an injection pulse generator for generating a train of actuating pulses, as a function of engine operating parameters, for actuating the electromagnetic device, the improvement comprising:

a magnetization period control circuit arrangement connected to the injection pulse generator; and switch means connected to the magnetization period control circuit arrangement and the electromagnetic device, wherein the magnetization period control circuit arrangement and the switch means provide for closure of the electromagnetic device for a portion of the period between successive pulses in the train of actuating pulses and a controlled advanced magnetization of the electromagnetic device for a different portion of the period between successive pulses in the train of actuating pulses, said magnetization period control circuit arrangement comprising:

at least one timing element means connected to the switch means and to the injection pulse generator for actuation by the train of actuating pulses; and control means connected to said at least one timing element means for controlling the actuation time of said at least one timing element means and consequently the onset of the advanced magnetization.

2. In an apparatus as defined in claim 1, wherein said at least one timing element means comprises a single timing element, and wherein the switch means comprises:

a logic gate connected at its input to the single timing element and to the injection pulse generator; and a series circuit comprising a switch and a resistor connected to the output of the logic gate and to the electromagnetic device.

3. In an apparatus as defined in claim 2, wherein the control means comprises:

storage means connected to the single timing element;

further switch means connected to the storage means; and at least one further timing element connected to the injection pulse generator and to the further switch means for controlling the state of the further switch means and the storage means and consequently the state of the single timing element.

4. In an apparatus as defined in claim 3, wherein the further switch means comprises two switches, wherein the control means further comprises at least one still further timing element, and wherein said at least one further timing element and said at least one still further timing element are connected to respective ones of the two switches.

5. In the apparatus as defined in claim 1, wherein the actuation pulses are a function of engine rpm.

6. In the apparatus as defined in claim 1, wherein the actuation pulses are a function of the battery voltage.

7. In the apparatus as defined in claim 1, wherein the actuation pulses are a function of engine rpm and battery voltage.

8. In the apparatus as defined in claim 1, wherein the advanced magnetization occurs by means of current synchronization.

* * * * *